United States Patent
Li et al.

(10) Patent No.: US 10,971,366 B2
(45) Date of Patent: Apr. 6, 2021

(54) METHODS FOR SILICIDE DEPOSITION

(71) Applicant: Applied Materials, Inc., Santa Clara, CA (US)

(72) Inventors: Xuebin Li, Sunnyvale, CA (US); Patricia M. Liu, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1 day.

(21) Appl. No.: 16/417,224

(22) Filed: May 20, 2019

(65) Prior Publication Data

US 2020/0013625 A1 Jan. 9, 2020

Related U.S. Application Data

(60) Provisional application No. 62/694,518, filed on Jul. 6, 2018.

(51) Int. Cl.
| | | |
|---|---|---|
| *H01L 21/285* | (2006.01) | |
| *H01L 21/02* | (2006.01) | |
| *H01L 21/67* | (2006.01) | |
| *H01L 21/28* | (2006.01) | |

(52) U.S. Cl.
CPC .... *H01L 21/28518* (2013.01); *H01L 21/0228* (2013.01); *H01L 21/02211* (2013.01); *H01L 21/02255* (2013.01); *H01L 21/28061* (2013.01); *H01L 21/67017* (2013.01)

(58) Field of Classification Search
CPC ......... H01L 21/28518; H01L 21/02211; H01L 21/28556
See application file for complete search history.

(56) References Cited

U.S. PATENT DOCUMENTS

| | | | |
|---|---|---|---|
| 4,884,123 A | 11/1989 | Dixit et al. | |
| 5,976,976 A * | 11/1999 | Doan ................ | H01L 21/28518 438/683 |
| 6,130,145 A * | 10/2000 | Ilg ....................... | H01L 29/4933 438/592 |
| 6,180,469 B1 | 1/2001 | Pramanick et al. | |
| 6,432,763 B1 | 8/2002 | Yu | |
| 6,512,273 B1 | 1/2003 | Krivokapic et al. | |
| 6,696,355 B2 | 2/2004 | Dennison | |
| 6,806,128 B2 | 10/2004 | Ootsuka et al. | |

(Continued)

FOREIGN PATENT DOCUMENTS

WO 9909586 A2 2/1999

OTHER PUBLICATIONS

H. Yu et al., "1.5x10-9 Ωcm2 Contact resistivity on highly doped Si:P using Ge pre-amorphization and Ti silicidation," 2015 IEEE International Electron Devices Meeting (IEDM), Washington, DC, 2015, pp. 21.7.1-21.7.4. (Year: 2015).*

(Continued)

*Primary Examiner* — John A Bodnar
(74) *Attorney, Agent, or Firm* — Patterson + Sheridan, LLP (57) ABSTRACT

Methods for depositing a metal silicide are provide and include heating a substrate having a silicon-containing surface to a deposition temperature, and exposing the substrate to a deposition gas to deposit a silicide film on the silicon-containing surface during a chemical vapor deposition process. The deposition gas contains a silicon precursor, a titanium or other metal precursor, and a phosphorus or other non-metal precursor.

20 Claims, 2 Drawing Sheets

(56) References Cited

U.S. PATENT DOCUMENTS

| | | |
|---|---|---|
| 7,005,666 B2 | 2/2006 | Dennison |
| 7,217,945 B2 | 5/2007 | Dennison et al. |
| 7,638,370 B2 | 12/2009 | Gossner et al. |
| 7,755,144 B2 | 7/2010 | Li et al. |
| 7,892,900 B2 | 2/2011 | Liu et al. |
| 8,586,436 B2 | 11/2013 | Ng et al. |
| 8,912,057 B1 | 12/2014 | Deniz |
| 2002/0005553 A1* | 1/2002 | Ootsuka .............. H01L 21/8238 257/369 |
| 2005/0194620 A1* | 9/2005 | Dennison ................ H01L 45/16 257/246 |
| 2006/0019495 A1 | 1/2006 | Marcadal et al. |
| 2006/0286776 A1 | 12/2006 | Ranish et al. |
| 2007/0209930 A1 | 9/2007 | Chua et al. |
| 2007/0249131 A1 | 10/2007 | Allen et al. |
| 2008/0093682 A1 | 4/2008 | Yao et al. |
| 2010/0075499 A1* | 3/2010 | Olsen .................. H01L 29/4933 438/682 |
| 2010/0129968 A1 | 5/2010 | Li et al. |
| 2012/0202338 A1 | 8/2012 | Ye et al. |
| 2014/0106547 A1 | 4/2014 | Ye et al. |
| 2014/0361375 A1* | 12/2014 | Deniz ................ H01L 21/76831 257/369 |
| 2016/0042963 A1 | 2/2016 | Kim et al. |
| 2018/0076324 A1 | 3/2018 | Huang et al. |
| 2018/0158682 A1 | 6/2018 | Dube et al. |
| 2018/0230624 A1 | 8/2018 | Dube et al. |
| 2018/0286961 A1 | 10/2018 | Bao et al. |

OTHER PUBLICATIONS

International Search Report and Written Opinion dated Aug. 29, 2019 for Application No. PCT/US2019/033854.

\* cited by examiner

METHODS FOR SILICIDE DEPOSITION

CROSS-REFERENCE TO RELATED APPLICATIONS

This application claims benefit to U.S. Application No. 62/694,518, filed on Jul. 6, 2018, which is herein incorporated by reference.

BACKGROUND

Field

Embodiments of the present disclosure generally relate to deposition processes, and in particular to processes for depositing silicide materials.

Description of the Related Art

Nickel or titanium silicides (e.g., NiSi or $TiSi_2$) are typically used in source/drain (S/D) contact area for contact resistivity (Rc) reduction in nMOS and pMOS. During subsequent high temperature annealing (e.g., about 700° C. or higher), the nickel or titanium silicide films suffer agglomeration in which silicide poly grains tend to spheroidize between grain boundaries which causes film discontinuity and higher Rc. Several methods have been proposed to reduce or suppress agglomeration of silicide films in order to achieve better thermal stability. These methods include the deposition of a protective layer (e.g., silicon nitride) and ion implantation (e.g., nitrogen) into the silicide film. However, these approaches negatively impact the resistivity of the silicide film and often do not alleviate the agglomeration issue.

Thus, there is a need for improved methods for depositing metal silicides that are more thermally stable and have a reduced or suppressed agglomeration compared to traditional silicides.

SUMMARY OF THE INVENTION

In one or more embodiments, a method for depositing a metal silicide (e.g., titanium silicide phosphide) is provided and includes heating a substrate having a silicon-containing surface to a deposition temperature, and exposing the substrate to a deposition gas to deposit a silicide film on the silicon-containing surface during a chemical vapor deposition (CVD) process, where the deposition gas contains a silicon precursor, a titanium precursor, and a phosphorus precursor.

In some embodiments, a method for depositing a metal silicide is provided and includes heating a substrate having a silicon-containing surface to a deposition temperature in a range from about 400° C. to about 750° C., where the silicon-containing surface is an upper surface of a source-drain, and exposing the substrate to a deposition gas to deposit a silicide film on the silicon-containing surface during a CVD process. The deposition gas contains a silicon precursor, a titanium precursor, and a non-metal precursor. The method also includes depositing a dielectric layer (e.g., silicon nitride) or a metal-containing barrier (e.g., titanium nitride) on the silicide film, and annealing the substrate containing the silicide film to a temperature of about 600° C. or greater.

In other embodiments, a method for depositing a metal silicide is provided and includes heating a substrate having a silicon-containing surface to a deposition temperature, and exposing the substrate to a deposition gas to deposit a silicide film on the silicon-containing surface during a CVD process. The deposition gas contains a silicon precursor, a metal precursor, and a dopant precursor. The metal precursor can be or include a titanium precursor, a cobalt precursor, a molybdenum precursor, a nickel precursor, or any combination thereof. The dopant precursor can be or include a phosphorus precursor, a boron precursor, an arsenic precursor, a carbon precursor, a nitrogen precursor, or any combination thereof.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described and discussed herein provide methods for depositing metal silicides (e.g., TiSiP or TiSiB) on a surface of a substrate. In one or more embodiments, a method for depositing a metal silicide includes heating a substrate having a silicon-containing surface to a deposition temperature and exposing the substrate to a deposition gas to deposit a silicide film on the silicon-containing surface during a chemical vapor deposition (CVD) process. The silicon-containing surface can be or include an upper surface of a source-drain region or other surfaces on the substrate or a feature disposed thereon. In some examples, the method includes depositing a dielectric layer (e.g., silicon nitride or high-k dielectric material) and/or a metal-containing barrier layer (e.g., titanium nitride) on the silicide film, and annealing the substrate containing the silicide film.

In one or more embodiments, silicide films containing metal silicides are deposited or otherwise formed by a silicide process. These silicide films can be deposited anywhere on a substrate or device that can benefit the properties of the metal silicide. In several examples, the silicide process can be an early silicide process or a late silicide process in which the silicide film is deposited on an upper surface of a source-drain region or extension formed within a metal-oxide-semiconductor field-effect transistor (MOSFET). In the early silicide process, the silicide film is deposited prior to the gate formation, while in the late silicide process, the silicide film is deposited within contact opening after the gate formation.

For example, during an early silicide process, the silicide film is selectively deposited on top of the source-drain region (e.g., the source-drain epitaxial film) and subsequently, the dielectric layer is deposited over the source-drain region/dummy gate region as a hardmask protects the source-drain epitaxial film and the silicide film during a subsequent gate formation integration process (e.g., high-k metal gate). After the gate formation, the dielectric layer, as the hardmask, on source-drain contact region is etched to expose the silicide film at the bottom, and one or more barrier layers are deposited within the contact opening, along the sidewalls of the contact opening and the bottom exposed silicide film. Thereafter, a metal contact is deposited to fill the contact opening. During the late silicide process, there is no silicide film deposition on source-drain region before the gate formation. The dielectric layer, as the hardmask, is deposited over the source-drain region/dummy gate region to protect the source-drain epitaxial film during a subsequent gate formation integration process (e.g., high-k metal gate). After the gate formation, the dielectric layer or hardmask on the source-drain contact region is etched away to expose the source-drain region at the bottom. Thereafter, the silicide film is selectively deposited on the exposed source-drain region, and subsequently, the barrier layer and the metal contact are formed.

In one or more embodiments, the early silicide process is performed on the substrate to deposit the metal silicide film thereon. Source-drains can be selectively epitaxially grown on the substrate, or alternatively, a silicon surface of the substrate or wafer can be doped to form the source-drain. A silicide film containing a metal silicide is selectively deposited on the source-drain while not depositing on the exposed dielectric layers between the source-drains. The substrate can be exposed to a millisecond anneal process, such as a dynamic surface anneal (DSA) or a laser spike anneal (LSA), to activate the dopants in the source-drain regions. For example, the millisecond anneal process includes heating the substrate to a temperature of about 800° C. to about 1,300° C., about 1,000° C. to about 1,300° C., about 1,100° C. to about 1,250° C., or about 1,150° C. to about 1,200° C. for a period of about 0.05 milliseconds to about 5 milliseconds, about 0.1 milliseconds to about 2 milliseconds, about 0.2 millisecond to about 1 millisecond, or about 0.5 millisecond to about 1 millisecond.

In early silicide process, a hardmask, such as a silicon nitride layer, can be deposited on the silicide film over the source-drain. Gate devices (e.g., high-K dielectric layer and metal gates) are formed bridging pairs of source-drain regions. A dielectric layer is deposited over the gate devices and any of the hardmask and/or the silicide film which may be exposed. A spike anneal is used to stabilize the dielectric layer. The substrate containing the silicide film and the dielectric layer can be heated to a temperature in a range from about 600° C. to about 1,200° C., about 600° C. to about 1,000° C., about 700° C. to about 1,100° C., about 800° C. to about 1,000° C., or about 850° C. to about 950° C., for a period of about 0.2 seconds to about 5 seconds, such as about 0.5 seconds to about 3 seconds or about 1 second to about 2 seconds, during the spike anneal process. The dielectric layer is etched or otherwise opened above the source-drain region to expose the silicide film therebelow. One or more barrier layers (e.g., metal-containing barrier layers) can be deposited on the sidewalls of the contact opening, as well as across the exposed silicide film within the contact opening. The barrier layer is exposed to a contact spike anneal. The substrate containing the silicide film, the dielectric layer, and the barrier layer can be heated to a temperature in a range from about 500° C. to about 800° C., such as about 550° C. to about 650° C., for a period of about 10 seconds to about 2 minutes, such as about 30 seconds to about 1 minute, during the spike anneal process. Thereafter, one or more contact metals can be formed on the barrier layer within the contact opening.

In other embodiments, the late silicide process is performed on the substrate to deposit a metal silicide film thereon. Source-drains can be selectively epitaxially grown on the substrate, or alternatively, a silicon surface of the substrate or wafer can be doped to form the source-drain. A hardmask, such as a silicon nitride layer, can be deposited on the source-drain regions. Gate devices (e.g., metal gates) are formed bridging pairs of source-drain regions. A dielectric layer is deposited over the gate devices. The dielectric layer is etched or otherwise opened above the source-drain region to form contact opening and expose the source-drain layers below. A silicide film containing a metal silicide can be selectively deposited on the source-drain layers while not depositing on the exposed sidewalls of the contact openings. One or more barrier layers (e.g., metal-containing barrier layers) can be deposited on the sidewalls of the contact opening, as well as across the exposed silicide film within the contact opening. The substrate containing the silicide film, the dielectric layer, and the barrier layer can be heated to a temperature in a range from about 500° C. to about 800° C., such as about 550° C. to about 650° C., for a period of about 10 seconds to about 2 minutes, such as about 30 seconds to about 1 minute, during the spike anneal process. One or more contact metals can be formed on the barrier layer within the contact opening.

In other embodiments, the substrate containing at least the silicide film is exposed to an annealing process, such as a soak anneal process, in an early or late silicide process. The substrate can be heated to a temperature in a range from about 500° C. to about 800° C., about 500° C. to about 700° C., about 550° C. to about 750° C., or about 600° C. to about 700° C. for a period of about 10 seconds to about 5 minutes, about 15 seconds to about 4 minutes, about 20 seconds to about 3 minutes, or about 30 seconds to about 2 minutes during the soak anneal process. For example, the temperature can be in a range from about 500° C. to about 700° C. for a period of about 10 seconds to about 1 minute during the soak anneal process.

Figure 1:
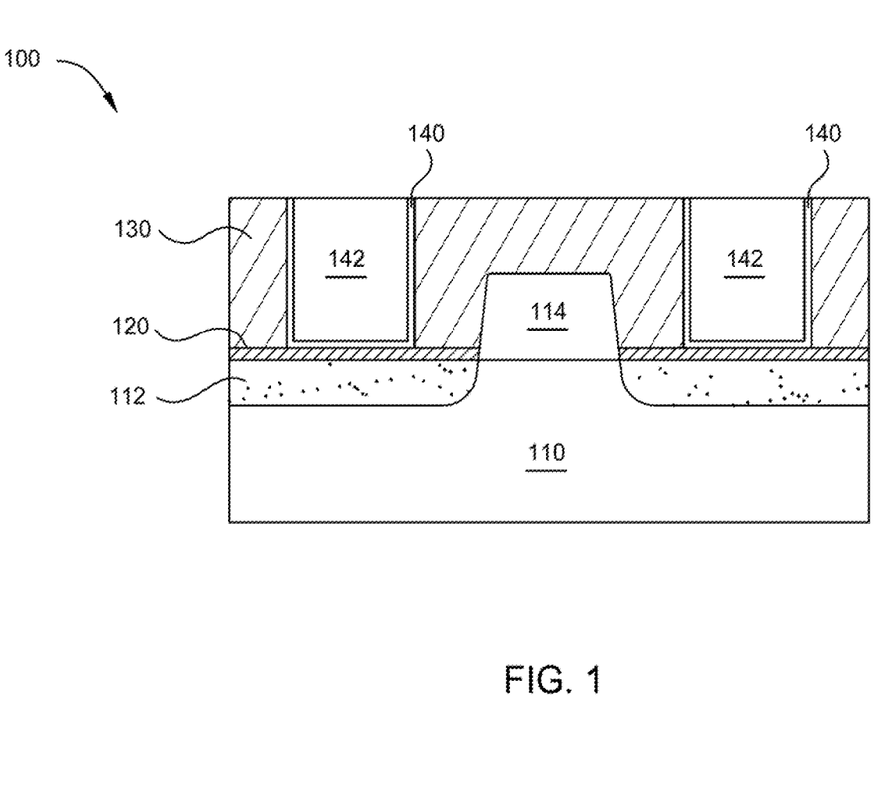
FIG. 1 depicts a metal silicide film deposited on an upper surface of a source-drain device during a silicidation process, as described and discussed in one or more embodiments herein.

In one or more embodiments, the silicide film is deposited on a silicon-containing surface of the substrate, such as an upper surface of a source-drain region or extension formed within a MOSFET, during a silicide deposition process. The silicide deposition process can be the early silicide process (e.g., prior to forming the gate and the dielectric high-k layer and exposed by the contact opening), as depicted in FIG. 1, or the late silicide process (e.g., deposited within contact opening), not shown, as described and discussed herein. The same film stack (e.g., source-drain layer/silicide film/barrier layer/contact) at the source-drain can be produced by both early and late silicide processes. In one or more examples, the silicide film can be or include titanium silicide phosphide or another metal silicide phosphide that is deposited on an nMOS region of the source-drain. In other examples, the silicide film can be or include a titanium silicide boride or another metal silicide boride that is deposited on a pMOS region of the source-drain.

FIG. 1 depicts a substrate 100 containing a source/drain layer 112 that can be selectively grown or deposited onto the surface of a wafer 110. In other examples, the source/drain layer 112 can be formed by implanting dopant ions into the surface of the wafer 110. The source/drain layer 112 is a silicon-containing layer. The segments of source/drain layer 112 are bridged by a gate device 114 disposed therebetween and on the wafer 110. Although not shown, the gate device 114 (e.g., metal gate) can include a gate layer formed on a gate oxide layer disposed on the wafer 110 and also include off-set layers deposited on the sides of the gate.

A silicide film 120 containing a metal silicide, as described and discussed herein, is deposited or otherwise formed on the source/drain layer 112. A dielectric layer 130 is deposited or otherwise over the gate device 114 and the silicide film 120. The dielectric layer 130 can contain silicon oxide, silicon nitride, silicon oxynitride, or any combination thereof. A contact opening is formed through the dielectric layer 130 to expose the silicide film 120. Thereafter, one or more barrier layers 140 can be deposited on the sidewalls of the contact opening, as well as across the exposed silicide film 120 within the contact opening. The barrier layer 140 can be or include one, two, or more of titanium, titanium nitride, tantalum, tantalum nitride, tungsten nitride, alloys thereof, or any combination thereof. A contact 142 can be formed on the barrier layer 140 to fill the contact opening. Contacts 142 can be or include one or more metals, such as tungsten, cobalt, copper, aluminum, alloys thereof, or any combination thereof.

The metal silicide films, such as the silicide film 120, deposited by the methods described and discussed herein, are more thermally stable and have a reduced or suppressed agglomeration compared to traditional silicides when exposed to a variety annealing processes, such as the millisecond anneal process, the spike anneal process, the soak anneal process, and/or other anneal processes.

The silicide film containing the metal silicide metal silicide is deposited or otherwise formed by a CVD process. A substrate having a silicon-containing surface (e.g., source-drain layers or regions) is heated to a deposition temperature and exposed to a deposition gas while depositing the silicide film on the silicon-containing surface. In one or more embodiments, the deposition gas contains a silicon precursor, a titanium or another metal precursor, and a non-metal precursor. In some examples, instead of the titanium precursor, other metal precursors, such as a cobalt precursor, a molybdenum precursor, a nickel precursor, or any combination thereof, are used during the CVD process. The non-metal precursor can be or include one or more phosphorus precursors, boron precursors, arsenic precursors, carbon precursors, nitrogen precursors, or any combination thereof. The silicon precursor can be or include silane, disilane, trisilane, tetrasilane, dichlorosilane, trichlorosilane, hexachlorodisilane, or any combination thereof. The titanium precursor can be or include titanium tetrachloride, tetrakis(dimethylamido) titanium, tetrakis(diethylamido) titanium, or any combination thereof. The phosphorus precursor can be or include phosphine, phosphorus trichloride, or any combination thereof.

During the CVD process, the precursors can have a variety of flow rates depending on process conditions (e.g., process temperature, process pressure, vapor pressure of precursor) and desired growth rate. One or more carrier gases can accompany or be combined with any of the precursors. Exemplary carrier gases can be or include, but are not limited to, nitrogen, hydrogen, argon, helium, or any combination thereof. In one or more examples, the titanium or other metal precursor can have a flow rate of about 0.1 sccm, about 1 sccm, about 2 sccm, about 5 sccm, about 10 sccm, about 20 sccm, about 50 sccm, or about 100 sccm to about 150 sccm, about 200 sccm, about 300 sccm, about 400 sccm, about 500 sccm, about 1,000 sccm, or greater. In other examples, the titanium or other metal precursor can have a flow rate of about 0.5 mg/min, about 1 mg/min, about 5 mg/min, about 10 mg/min or about 20 mg/min to about 25 mg/min, about 30 mg/min, about 50 mg/min, about 65 mg/min, about 80 mg/min, about 100 mg/min, or greater. The phosphorus or other non-metal precursor can have a flow rate of about 0.1 sccm, about 1 sccm, about 3 sccm, or about 5 sccm to about 8 sccm, about 10 sccm, about 15 sccm, about 20 sccm, about 25 sccm, about 50 sccm, about 100 sccm, or greater. The silicon precursor can have a flow rate of about 0.1 sccm, about 1 sccm, about 10 sccm, about 30 sccm, or about 50 sccm to about 80 sccm, about 100 sccm, about 150 sccm, about 200 sccm, about 250 sccm, about 300 sccm, about 500 sccm, or greater. In one or more examples, the titanium or other metal precursor has a flow rate in a range from about 1 sccm to about 10 sccm, the phosphorus or other non-metal precursor has a flow rate in a range from about 1 sccm to about 30 sccm, and the silicon precursor has a flow rate in a range from about 1 sccm to about 300 sccm.

The silicide films contains one or more metal silicides that can be or include, but are not limited to, titanium silicide phosphide, titanium silicide boride, titanium silicide arsenide, titanium silicide carbide, titanium silicide nitride, cobalt silicide phosphide, cobalt silicide boride, cobalt silicide arsenide, cobalt silicide carbide, cobalt silicide nitride, molybdenum silicide phosphide, molybdenum silicide boride, molybdenum silicide arsenide, molybdenum silicide carbide, molybdenum silicide nitride, nickel silicide phosphide, nickel silicide boride, nickel silicide arsenide, nickel silicide carbide, nickel silicide nitride, alloys thereof, dopants thereof, or any combination thereof.

During the CVD process, the substrate is heated to the deposition temperature and exposed to the deposition gas while forming, depositing, or otherwise producing the silicide film. The deposition temperature can be from about 350° C., about 375° C., about 400° C., about 450° C., or about 500° C. to about 550° C., about 600° C., about 650° C., about 700° C., about 750° C., or about 800° C. For example, the deposition temperature can be from about 350° C. to about 800° C., about 375° C. to about 800° C., about 400° C. to about 800° C., about 400° C. to about 750° C., about 400° C. to about 700° C., about 400° C. to about 650° C., about 400° C. to about 600° C., about 400° C. to about 650° C., about 450° C. to about 800° C., about 450° C. to about 750° C., about 450° C. to about 700° C., about 450° C. to about 600° C., about 450° C. to about 650° C., about 500° C. to about 800° C., about 500° C. to about 750° C., about 500° C. to about 700° C., about 500° C. to about 600° C., or about 500° C. to about 650° C.

In one or more embodiments, the silicide film contains one or more metal silicide non-metal (MSiNM) materials, where M is one or more metal elements and NM is one or more non-metal elements. In one or more examples, the MSiNM materials have a metal:silicon (M:Si) atomic ratio from about 2:1 to about 15:1 and a non-metal:silicon (NM:Si) atomic ratio about 2:1 to about 12:1. In some examples, the silicide film and/or the MSiNM material has an M:Si atomic ratio from about 4:1 to about 12:1 and a NM:Si atomic ratio about 4:1 to about 10:1. In other examples, the silicide film and/or the MSiNM material has an M:Si atomic ratio from about 6:1 to about 10:1 and a NM:Si atomic ratio about 6:1 to about 10:1. For example, the silicide film and/or the MSiNM material can have an M:NM:Si atomic ratio of 10:10:1. In some examples, the silicide film containing titanium silicide phosphide has a Ti:Si atomic ratio from about 2:1 to about 15:1 and a P:Si atomic ratio about 2:1 to about 12:1. In some examples, the silicide film containing titanium silicide phosphide has a Ti:Si atomic ratio from about 4:1 to about 12:1 and a P:Si atomic ratio about 4:1 to about 10:1. In other examples, the silicide film containing titanium silicide phosphide has a Ti:Si atomic ratio from about 6:1 to about 10:1 and a P:Si atomic ratio about 6:1 to about 10:1. For example, the silicide film can have a Ti:P:Si atomic ratio of 10:10:1.

The silicide film can have a concentration of titanium or other metal (e.g., Co, Mo, Ni) of about 40 atomic percent (at %), about 45 at %, about 50 at %, or about 52 at % to about 55 at %, about 58 at %, about 60 at %, about 65 at %, or about 70 at %. For example, the silicide film can have a concentration of titanium or other metal of about 40 at % to about 70 at %, about 40 at % to about 65 at %, about 40 at % to about 60 at %, about 40 at % to about 55 at %, about 45 at % to about 70 at %, about 45 at % to about 65 at %, about 45 at % to about 60 at %, about 45 at % to about 55 at %, about 50 at % to about 70 at %, about 50 at % to about 65 at %, about 50 at % to about 60 at %, about 50 at % to about 55 at %, about 55 at % to about 70 at %, about 55 at % to about 65 at %, or about 55 at % to about 60 at %.

The silicide film can have a concentration of phosphorus or other non-metal (e.g., B, As, C, N) of about 1 at %, about 5 at %, about 10 at %, about 15 at %, about 20 at %, about 25 at %, about 30 at %, or about 32 at % to about 35 at %, about 38 at %, about 40 at %, about 45 at %, or about 50 at %. For example, the silicide film can have a concentration of phosphorus or other non-metal of about 1 at % to about 30 at %, about 1 at % to about 25 at %, about 1 at % to about 20 at %, about 1 at % to about 15 at %, about 1 at % to about 10 at %, about 1 at % to about 5 at %, about 1 at % to about 3 at %, about 5 at % to about 30 at %, about 5 at % to about 25 at %, about 5 at % to about 20 at %, about 5 at % to about 15 at %, about 5 at % to about 10 at %, about 5 at % to about 8 at %, about 10 at % to about 30 at %, about 10 at % to about 25 at %, about 10 at % to about 20 at %, about 10 at % to about 15 at %, about 10 at % to about 12 at %, about 20 at % to about 50 at %, about 20 at % to about 45 at %, about 20 at % to about 40 at %, about 20 at % to about 35 at %, about 25 at % to about 50 at %, about 25 at % to about 45 at %, about 25 at % to about 40 at %, about 25 at % to about 35 at %, about 30 at % to about 50 at %, about 30 at % to about 45 at %, about 30 at % to about 40 at %, about 30 at % to about 35 at %, about 35 at % to about 50 at %, about 35 at % to about 45 at %, or about 35 at % to about 40 at %.

The silicide film can have a concentration of silicon of about 1 at %, about 2 at %, about 3 at %, about 4 at %, about 5 at %, about 7 at %, about 10 at %, about 12 at %, or about 15 at % to about 16 at %, about 18 at %, about 20 at %, about 23 at %, about 25 at %, about 28 at %, or about 30 at %. For example, the silicide film can have a concentration of silicon of about 1 at % to about 50 at %, about 1 at % to about 40 at %, about 1 at % to about 30 at %, about 1 at % to about 25 at %, about 1 at % to about 20 at %, about 1 at % to about 15 at %, about 2 at % to about 30 at %, about 2 at % to about 25 at %, about 2 at % to about 20 at %, about 2 at % to about 15 at %, about 5 at % to about 30 at %, about 5 at % to about 25 at %, about 5 at % to about 20 at %, about 5 at % to about 15 at %, about 10 at % to about 30 at %, about 10 at % to about 25 at %, about 10 at % to about 20 at %, about 10 at % to about 15 at %, about 15 at % to about 30 at %, about 15 at % to about 25 at %, about 15 at % to about 20 at %, or about 15 at % to about 18 at %.

In one or more examples, the silicide film can include about 40 at % to about 70 at % of titanium, about 20 at % to about 50 at % of phosphorus, and about 1 at % to about 25 at % of silicon. In some examples, the silicide film can include about 45 at % to about 65 at % of titanium, about 20 at % to about 45 at % of phosphorus, and about 2 at % to about 20 at % of silicon. In other examples, the silicide film can include about 50 at % to about 60 at % of titanium, about 25 at % to about 45 at % of phosphorus, and about 2 at % to about 15 at % of silicon.

The silicide film can be deposited to any desirable thickness, depending on where and how the silicide film is used on the substrate or device. The silicide film can have a thickness of about 5 nm, about 10 nm, about 15 nm, about 20 nm, or about 25 nm to about 30 nm, about 40 nm, about 50 nm, about 60 nm, about 80 nm, about 100 nm, about 120 nm, about 150 nm, about 200 nm, or thicker. For example, the silicide film can have a thickness of about 5 nm to about 150 nm, about 5 nm to about 120 nm, about 5 nm to about 100 nm, about 5 nm to about 80 nm, about 5 nm to about 50 nm, about 5 nm to about 40 nm, about 10 nm to about 150 nm, about 10 nm to about 120 nm, about 10 nm to about 100 nm, about 10 nm to about 80 nm, about 10 nm to about 50 nm, about 10 nm to about 40 nm, about 15 nm to about 150 nm, about 15 nm to about 120 nm, about 15 nm to about 100 nm, about 15 nm to about 80 nm, about 15 nm to about 50 nm, about 15 nm to about 40 nm, or about 15 nm to about 30 nm.

The silicide film can have a resistivity of about 100 $\mu\Omega$-cm, about 125 $\mu\Omega$-cm, about 150 $\mu\Omega$-cm, about 175 $\mu\Omega$-cm, or about 200 $\mu\Omega$-cm to about 225 $\mu\Omega$-cm, about 250 $\mu\Omega$-cm, about 275 $\mu\Omega$-cm, about 300 $\mu\Omega$-cm, about 325 $\mu\Omega$-cm, or about 350 $\mu\Omega$-cm. For example, the silicide film can have a resistivity of about 100 $\mu\Omega$-cm to about 350 $\mu\Omega$-cm, about 125 $\mu\Omega$-cm to about 300 $\mu\Omega$-cm, about 150 $\mu\Omega$-cm to about 300 $\mu\Omega$-cm, about 175 $\mu\Omega$-cm to about 300 $\mu\Omega$-cm, about 200 $\mu\Omega$-cm to about 300 $\mu\Omega$-cm, about 250 $\mu\Omega$-cm to about 300 $\mu\Omega$-cm, about 125 $\mu\Omega$-cm to about 250 $\mu\Omega$-cm, about 150 $\mu\Omega$-cm to about 250 $\mu\Omega$-cm, about 175 $\mu\Omega$-cm to about 250 $\mu\Omega$-cm, or about 200 $\mu\Omega$-cm to about 250 $\mu\Omega$-cm.

In deposition processes described and discussed herein, silicide films containing a metal silicide and/or other silicon-containing materials are deposited or otherwise formed by CVD processes, where CVD processes can be or include atomic layer deposition (ALD) processes and/or atomic layer epitaxy (ALE) processes. Chemical vapor deposition includes the use of many techniques, such as thermal CVD, plasma-assisted CVD (PA-CVD), atomic layer CVD (AL-CVD), organometallic or metalorganic CVD (OMCVD or MOCVD), laser-assisted CVD (LA-CVD), ultraviolet CVD (UV-CVD), hot-wire (HWCVD), reduced-pressure CVD (RP-CVD), ultra-high vacuum CVD (UHV-CVD) and others. In one or more embodiments, thermal CVD is used to epitaxially grow, form, or otherwise deposit silicide films, as described and discussed herein.

Figure 2:
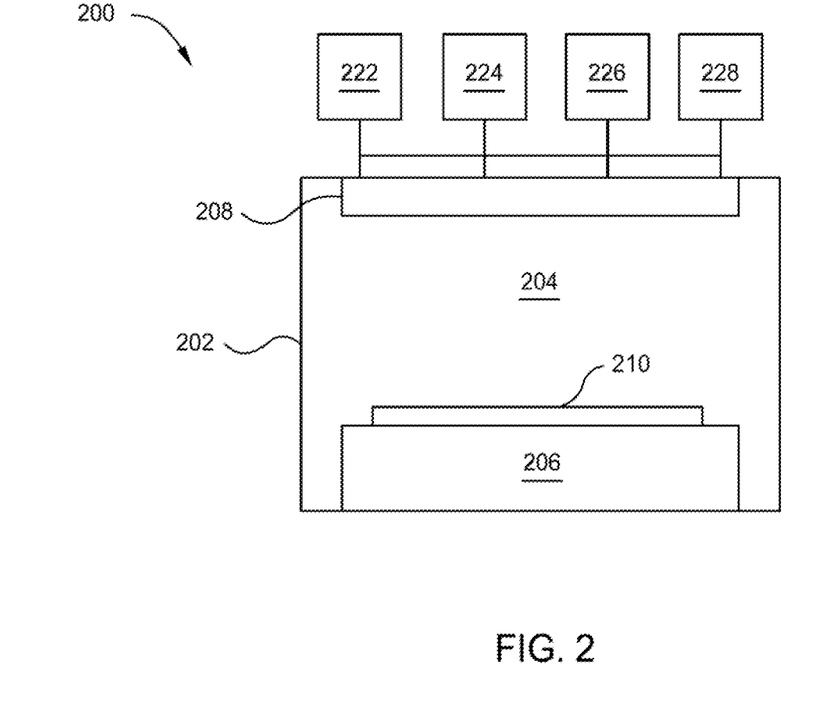
FIG. 2 depicts a schematic of a process system that can be used to deposit metal silicide films, as described and discussed in one or more embodiments herein.

FIG. 2 depicts a schematic of a process system 200 that can be used to deposit silicide films containing metal silicide. The process system 200 can be or include one or more CVD, ALD, or ALE chambers and/or systems. The process system 200 includes a deposition or process chamber 202 having an interior volume or process region 204, a substrate support 206, and a gas distribution system 208 (e.g., showerhead). A substrate 210 can be disposed on the substrate support 206 and processed by methods described and discussed herein. Sources 222, 224, 226, 228 are coupled to the process chamber 202 and in fluid communication with the process region 204 via the gas distribution system 208. Sources 222, 224, 226, 228 can contain precursors, reagents, carrier or purge gas, and other types of chemical components used during processing. In one or more examples, the source 222 is a silicon precursor source and contains a silicon precursor, the source 224 is a titanium or other metal precursor source and contains a titanium or other metal precursor, the source 226 is a phosphorus or other non-metal precursor source and contains a phosphorus or non-metal precursor, and the source 228 is carrier or purge gas source and contains one or more carrier gases or purge gases (e.g., $N_2$, $H_2$, Ar, He, or combinations thereof).

The deposition processes for depositing the silicide films containing metal silicide can be performed in a CVD, ALD, ALE, and other process or deposition chambers and systems. The process or deposition chamber brings the sources into contact with a heated substrate on which the silicide films containing a metal silicide are deposited. The processes can be conducted at a pressure in a range from about 0.1 Torr to about 500 Torr, about 1 Torr to about 400 Torr, or about 5 Torr to about 300 Torr. The process or deposition chambers and systems that can be used to deposit the silicide films can be or include the Epi Centura® system and the Poly Gen® system, both available from Applied Materials, Inc., located in Santa Clara, Calif.

Embodiments of the present disclosure further relate to any one or more of the following paragraphs:

1. A method for depositing a metal silicide, comprising: heating a substrate having a silicon-containing surface to a deposition temperature; and exposing the substrate to a deposition gas to deposit a silicide film on the silicon-containing surface during a chemical vapor deposition process, wherein the deposition gas comprises a silicon precursor, a titanium precursor, and a phosphorus precursor.

2. A method for depositing a metal silicide, comprising: heating a substrate having a silicon-containing surface to a deposition temperature; and exposing the substrate to a deposition gas to deposit a silicide film on the silicon-containing surface during a chemical vapor deposition process, wherein the deposition gas comprises a silicon precursor, a metal precursor, and a dopant precursor, wherein the metal precursor comprises a titanium precursor, a cobalt precursor, a molybdenum precursor, a nickel precursor, or any combination thereof and the dopant precursor comprises a phosphorus precursor, a boron precursor, an arsenic precursor, a carbon precursor, a nitrogen precursor, or any combination thereof.

3. A method for depositing a metal silicide, comprising: heating a substrate having a silicon-containing surface to a deposition temperature in a range from about 400° C. to about 750° C., wherein the silicon-containing surface is an upper surface of a source-drain; exposing the substrate to a deposition gas to deposit a silicide film on the silicon-containing surface during a chemical vapor deposition process, wherein the deposition gas comprises a silicon precursor, a titanium precursor, and a non-metal precursor; depositing a dielectric layer or a metal-containing barrier on the silicide film; and annealing the substrate containing the silicide film to a temperature of about 600° C. or greater.

4. The method of paragraph 3, wherein the non-metal precursor comprises a phosphorus precursor, a boron precursor, an arsenic precursor, a carbon precursor, a nitrogen precursor, or any combination thereof.

5. The method according to any one of paragraphs 1-4, wherein the silicide film comprises a titanium silicide boride and is deposited on a pMOS region of the source-drain.

6. The method according to any one of paragraphs 1-4, wherein the silicide film comprises a titanium silicide phosphide and is deposited on an nMOS region of the source-drain.

7. The method according to any one of paragraphs 1-6, wherein the deposition temperature is in a range from about 400° C. to about 750° C.

8. The method according to any one of paragraphs 1-7, wherein the silicide film has a Ti:Si atomic ratio from about 2:1 to about 15:1 and a P:Si atomic ratio about 2:1 to about 12:1.

9. The method according to any one of paragraphs 1-8, wherein the silicide film comprises about 40 atomic percent (at %) to about 70 at % of titanium, about 1 at % to about 50 at % of phosphorus, and about 1 at % to about 25 at % of silicon.

10. The method according to any one of paragraphs 1-9, wherein the silicide film comprises about 50 at % to about 60 at % of titanium, about 25 at % to about 45 at % of phosphorus, and about 2 at % to about 15 at % of silicon.

11. The method according to any one of paragraphs 1-10, wherein the silicide film has a resistivity of about 150 µΩ-cm to about 300 µΩ-cm.

12. The method according to any one of paragraphs 1-11, wherein the silicide film has a resistivity of about 200 µΩ-cm to about 250 µΩ-cm.

13. The method according to any one of paragraphs 1-12, wherein the silicide film has a thickness of about 10 nm to about 50 nm.

14. The method according to any one of paragraphs 1-13, wherein the silicide film has a thickness of about 15 nm to about 50 nm.

15. The method according to any one of paragraphs 1-14, wherein the silicide film has a thickness of about 15 nm to about 30 nm.

16. The method according to any one of paragraphs 1-15, wherein the silicon precursor comprises silane, disilane, trisilane, tetrasilane, dichlorosilane, trichlorosilane, hexachlorodisilane, or any combination thereof.

17. The method according to any one of paragraphs 1-16, wherein the titanium precursor comprises titanium tetrachloride, tetrakis(dimethylamido) titanium, tetrakis(diethylamido) titanium, or any combination thereof.

18. The method according to any one of paragraphs 1-17, wherein the phosphorus precursor comprises phosphine, phosphorus trichloride, or any combination thereof.

19. The method according to any one of paragraphs 1-18, wherein during the chemical vapor deposition process, the titanium precursor has a flow rate in a range from about 1 sccm to about 10 sccm, the phosphorous precursor has a flow rate in a range from about 1 sccm to about 30 sccm, and the silicon precursor has a flow rate in a range from about 1 sccm to about 300 sccm.

20. The method according to any one of paragraphs 1-19, wherein the silicon-containing surface is an upper surface of a source-drain, and wherein the silicide film is deposited thereon.

21. The method according to any one of paragraphs 1-20, further comprising depositing a dielectric layer or a metal-containing barrier on the silicide film.

22. The method according to any one of paragraphs 1-21, further comprising heating the substrate containing the silicide film to a temperature in a range from about 800° C. to about 1,300° C. for a period of about 0.1 milliseconds to about 2 milliseconds during a millisecond anneal process.

23. The method according to any one of paragraphs 1-22, further comprising heating the substrate containing the silicide film to a temperature in a range from about 600° C. to about 1,000° C. for a period of about 0.5 seconds to about 3 seconds during a spike anneal process.

24. The method according to any one of paragraphs 1-23, further comprising heating the substrate containing the silicide film to a temperature in a range from about 500° C. to about 700° C. for a period of about 10 seconds to about 1 minute during a soak anneal process.

25. A process system for performing the method according to any one of paragraphs 1-24, comprising: a process chamber having a process region containing the substrate during the chemical vapor deposition process; a silicon precursor source in fluid communication with the process region and containing the silicon precursor; a titanium precursor source in fluid communication with the process region and containing the titanium precursor; and a non-metal precursor source in fluid communication with the process region and containing the non-metal precursor.

26. The process system of paragraph 25, wherein the non-metal precursor comprises a phosphorus precursor, a boron precursor, an arsenic precursor, a carbon precursor, a nitrogen precursor, or any combination thereof.

27. A process system for performing the method according to any one of paragraphs 1-24, comprising: a process chamber having a process region containing the substrate during the chemical vapor deposition process; a silicon precursor source in fluid communication with the process region and containing the silicon precursor; a titanium precursor source in fluid communication with the process region and containing the titanium precursor; and a phosphorus precursor source in fluid communication with the process region and containing the non-metal precursor.

While the foregoing is directed to implementations of the disclosure, other and further implementations may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method for depositing a metal silicide, comprising:
   heating a substrate having a silicon-containing surface to a deposition temperature; and
   exposing the substrate to a deposition gas to deposit a silicide film on the silicon-containing surface during a chemical vapor deposition process, wherein the deposition gas comprises a silicon precursor, a titanium precursor, and a phosphorus precursor;
   wherein the silicide film has a Ti:Si atomic ratio from about 2:1 to about 15:1 and a P:Si atomic ratio about 2:1 to about 12:1.

2. The method of claim 1, wherein the deposition temperature is in a range from about 400° C. to about 750° C.

3. The method of claim 1, wherein the silicide film comprises about 40 atomic percent (at %) to about 70 at % of titanium.

4. The method of claim 1, wherein the silicide film comprises about 50 at % to about 60 at % of titanium.

5. The method of claim 1, wherein the silicide film has a resistivity of about 150 μΩ-cm to about 300 μΩ-cm.

6. The method of claim 1, wherein the silicon precursor comprises silane, disilane, trisilane, tetrasilane, dichlorosilane, trichlorosilane, hexachlorodisilane, or any combination thereof, the titanium precursor comprises titanium tetrachloride, tetrakis(dimethylamido) titanium, tetrakis(diethylamido) titanium, or any combination thereof, and the phosphorus precursor comprises phosphine, phosphorus trichloride, or any combination thereof.

7. The method of claim 1, wherein the silicon-containing surface is an upper surface of a source-drain, and wherein the silicide film is deposited thereon.

8. The method of claim 1, further comprising depositing a dielectric layer or a metal-containing barrier on the silicide film.

9. The method of claim 1, further comprising heating the substrate containing the silicide film to a temperature in a range from about 800° C. to about 1,300° C. for a period of about 0.1 milliseconds to about 2 milliseconds during a millisecond anneal process.

10. The method of claim 1, further comprising heating the substrate containing the silicide film to a temperature in a range from about 600° C. to about 1,000° C. for a period of about 0.5 seconds to about 3 seconds during a spike anneal process.

11. The method of claim 1, further comprising heating the substrate containing the silicide film to a temperature in a range from about 500° C. to about 700° C. for a period of about 10 seconds to about 1 minute during a soak anneal process.

12. A method for depositing a metal silicide, comprising:
    heating a substrate having a silicon-containing surface to a deposition temperature in a range from about 400° C. to about 750° C., wherein the silicon-containing surface is an upper surface of a source-drain;
    exposing the substrate to a deposition gas to deposit a silicide film on the silicon-containing surface during a chemical vapor deposition process, wherein the deposition gas comprises a silicon precursor, a titanium precursor, and a non-metal precursor;
    depositing a dielectric layer or a metal-containing barrier on the silicide film; and
    annealing the substrate containing the silicide film to a temperature of about 600° C. or greater;
    wherein the silicide film comprises a titanium silicide phosphide; and
    wherein the silicide film is deposited on an nMOS region of the source-drain.

13. The method of claim 12, wherein the non-metal precursor comprises a phosphorus precursor, an arsenic precursor, a carbon precursor, a nitrogen precursor, or any combination thereof.

14. The method of claim 12, wherein the silicide film comprises about 40 atomic percent (at %) to about 70 at % of titanium, about 20 at % to about 50 at % of phosphorus, and about 1 at % to about 25 at % of silicon.

15. The method of claim 12, wherein annealing the substrate further comprises:
heating the substrate containing the silicide film to a temperature in a range from about 800° C. to about 1,300° C. for a period of about 0.1 milliseconds to about 2 milliseconds during a millisecond anneal process;
heating the substrate containing the silicide film to a temperature in a range from about 600° C. to about 1,000° C. for a period of about 0.5 seconds to about 3 seconds during a spike anneal process; or
heating the substrate containing the silicide film to a temperature in a range from about 500° C. to about 700° C. for a period of about 10 seconds to about 1 minute during a soak anneal process.

16. A method for depositing a metal silicide, comprising:
heating a substrate having a silicon-containing surface to a deposition temperature; and
exposing the substrate to a deposition gas to deposit a silicide film on the silicon-containing surface during a chemical vapor deposition process, wherein the deposition gas comprises a silicon precursor, a titanium precursor, and a phosphorus precursor,
wherein the silicide film comprises about 50 at % to about 60 at % of titanium, about 25 at % to about 45 at % of phosphorus, and about 2 at % to about 15 at % of silicon.

17. The method of claim 16, wherein the deposition temperature is in a range from about 400° C. to about 750° C.

18. A method for depositing a metal silicide, comprising:
heating a substrate having a silicon-containing surface to a deposition temperature in a range from about 400° C. to about 750° C., wherein the silicon-containing surface is an upper surface of a source-drain;
exposing the substrate to a deposition gas to deposit a silicide film on the silicon-containing surface during a chemical vapor deposition process, wherein the deposition gas comprises a silicon precursor, a titanium precursor, and a non-metal precursor;
depositing a dielectric layer or a metal-containing barrier on the silicide film; and
annealing the substrate containing the silicide film to a temperature of about 600° C. or greater;
wherein the silicide film comprises a titanium silicide boride; and
wherein the silicide film is deposited on a pMOS region of the source-drain.

19. The method of claim 18, wherein the non-metal precursor comprises a boron precursor, a carbon precursor, or any combination thereof.

20. The method of claim 18, wherein the silicide film comprises about 40 atomic percent (at %) to about 70 at % of titanium and about 1 at % to about 25 at % of silicon.

* * * * *